United States Patent
Ou et al.

(10) Patent No.: US 12,278,464 B2
(45) Date of Patent: Apr. 15, 2025

(54) EDGE EMITTING LASER DEVICE

(71) Applicant: ABOCOM SYSTEMS, INC., Miaoli County (TW)

(72) Inventors: Cheng-Yi Ou, Miaoli County (TW); Chih-Yuan Lin, Miaoli County (TW); Cheng-Hsiao Chi, Miaoli County (TW)

(73) Assignee: ABOCOM SYSTEMS, INC., Miaoli County (TW)

( * ) Notice: Subject to any disclaimer, the term of this patent is extended or adjusted under 35 U.S.C. 154(b) by 703 days.

(21) Appl. No.: 17/569,516

(22) Filed: Jan. 6, 2022

(65) Prior Publication Data

US 2022/0247154 A1 Aug. 4, 2022

(30) Foreign Application Priority Data

Jan. 29, 2021 (TW) .................. 110103352

(51) Int. Cl.
*H01S 5/30* (2006.01)
*H01S 5/12* (2021.01)
*H01S 5/20* (2006.01)
*H01S 5/34* (2006.01)
*H01S 5/343* (2006.01)

(52) U.S. Cl.
CPC .......... *H01S 5/20* (2013.01); *H01S 5/12* (2013.01); *H01S 5/3077* (2013.01); *H01S 5/3416* (2013.01); *H01S 5/343* (2013.01)

(58) Field of Classification Search
CPC .................. H01S 5/3095; H01S 5/12
See application file for complete search history.

(56) References Cited

U.S. PATENT DOCUMENTS

| | | | | |
|---|---|---|---|---|
| 7,813,395 | B1* | 10/2010 | Verma | H01S 5/12 372/46.01 |
| 2005/0063440 | A1* | 3/2005 | Deppe | H01S 5/18327 372/50.1 |
| 2013/0208751 | A1 | 8/2013 | Nakahara et al. | |
| 2018/0031362 | A1 | 2/2018 | Kondo | |
| 2018/0366909 | A1 | 12/2018 | Kitatani et al. | |

FOREIGN PATENT DOCUMENTS

CN 104682195 * 6/2015 .............. H01S 5/32

* cited by examiner

*Primary Examiner* — Xinning(Tom) Niu
*Assistant Examiner* — Delma R Forde
(74) *Attorney, Agent, or Firm* — Fei-hung Yang

(57) ABSTRACT

An edge emitting laser (EEL) device includes a substrate, an n-type buffer layer, a first n-type cladding layer, a grating layer, a spacer layer, a lower confinement unit, an active layer, an upper confinement unit, a p-type cladding layer, a tunnel junction layer and a second n-type cladding layer sequentially arranged from bottom to top. The tunnel junction layer can stop an etching process from continuing to form the second n-type cladding layer into a predetermined ridge structure and converting a part of the p-type cladding layer into the n-type cladding layer to reduce series resistance of the EEL device. Therefore, the optical field and active layer tend to be coupled at the middle of the active layer, the lower half of the active layer can be utilized effectively, and the optical field is near to the grating layer to achieve better optical field/grating coupling efficiency and lower threshold current.

4 Claims, 7 Drawing Sheets

EDGE EMITTING LASER DEVICE

CROSS-REFERENCE TO RELATED APPLICATIONS

This non-provisional application claims priority under 35 U.S.C. § 119(a) on Patent Application No(s). 110103352 filed in Taiwan, R.O.C. on Jan. 29, 2021, the entire contents of which are hereby incorporated by reference.

BACKGROUND

Technical Field

The present disclosure relates to an edge emitting laser (EEL) device, and more particularly to a Fabry-Perot (FP) laser device, a distributed feedback (DFB) laser device, and a laser device with a ridge waveguide structure.

Description of Related Art

Semiconductor light emitting device can be divided into light emitting diode (LED) device and laser diode (LD) device. The LED device is a divergent light source, but its luminous energy is weak and the beam angle is too large, so that its functionality is insufficient and the LED device can only provide general lighting or can be used in 2D sensing systems. On the other hand, the LD device generates laser light with a beam angle and a shape which are relatively more concentrated that those of the LED devices, and it has the advantages of lower power consumption, high efficiency and high speed, so that the LD device is suitable for the applications of 3D sensing and optical communication. From the aspect of structure, the LD device structure is more complicated, the material requirement is higher, and the design is more difficult than those of the LED device, so that the mass production of the LD devices requires a higher level of difficulty of the epitaxial technology. Although both of the LD device and the LED device are light emitting devices, they are different in use, efficacy, structure and technology.

The edge emitting laser (EEL) device can be divided into Fabry-Perot (FP) laser device and distributed feedback (DFB) laser device. The FP laser device is formed by epitaxy, and includes: a substrate, an n-type buffer layer, an n-type cladding layer, a lower confinement which is a separated confinement hetero-structure, SCH) layer, an active layer, an upper confinement layer, a p-type cladding layer and a contact layer, which are arranged from bottom to top. The DFB laser device is also formed by epitaxy, and the structure of the DFB laser device includes: a substrate, an n-type buffer layer, an n-type cladding layer, a grating layer, a spacer layer, a lower confinement layer, an active layer, an upper confinement layer, a p-type cladding layer and a contact layer, which are arranged from bottom to top. In addition, the FP laser device and the DFB laser device further include a ridge structure formed by removing a part of the p-type cladding layer and the contact layer by an etching method, and this type of FP laser device and DFB laser device has the etch stop layer buried into the p-type cladding layer. For example, the p-type cladding layer is divided into a lower p-type cladding layer and an upper p-type cladding layer, and the etch stop layer is formed between the lower p-type cladding layer and the upper p-type cladding layer by epitaxy. In the aforementioned etching method, a part of the upper p-type cladding layer and the contact layer is removed to form the ridge structure, and the etch stop layer is provided for stopping further any etching.

The n-type cladding layer and the p-type cladding layer are the sources of the series resistance of the FP laser device and the DFB laser device, and one of the ways to overcome the high series resistance is to perform a high-concentration of silicon and zinc doping of the n-type cladding layer and the p-type cladding layer. In general, the resistance of the p-type cladding layer is much greater than the resistance of the n-type cladding layer, such that most of the series resistances of the FP laser device and the DFB laser device come with the p-type cladding layer. However, the concentration for the zinc doping of p-type cladding layer cannot be controlled easily, and if it is necessary to have a p-type cladding layer with a resistance lower than the predetermined resistance value, the doping concentration of zinc is adjusted to over $2.5 \times 10^{18}$ atoms/cm$^3$, but such high doping concentration of zinc will make the epitaxial growth of the p-type cladding layer very difficult, the value of the threshold current ($I_{th}$) of the p-type cladding layer unable to be reduced, thereby affecting the electrical property, and the p-type cladding layer absorbing light, or even after the FP laser device and the DFB laser device have been used for a period of time, the too-high concentration zinc in the p-type cladding layer will migrate to the active layer and affect the performance of the active layer. Therefore, the traditional EEL device has encountered an issue of unable to effectively overcome the high series resistance.

In the operating principle of EEL device, carriers such as electrons and electron holes are injected into the active layer (quantum well, or multi-quantum well) to couple and emit light, and the laser optical field is confined by the n-type cladding layer and the p-type cladding layer in a resonant cavity formed by the lower confinement layer, the upper confinement layer and the active layer. The level of coupling the optical field with the quantum well of the active layer determines the modal gain. The higher the modal gain, the easier the way of overcoming the optical loss to achieve lasing, and the easier the reduction of the aforementioned threshold current value generated by the laser. In the structure of the traditional FP laser device and DFB laser device, the electrons coming from the n-type cladding layer and the lower confinement layer at the bottom side of the laser device has a mobility greater than the electron holes coming from the p-type cladding layer and the upper confinement layer at the top side of the laser device, so that most of the electrons and electron holes are actually coupled at the upper half of the active layer to emit light, thereby leading to the fact that the lower half of the active layer cannot be utilized effectively. In addition, this will make most of the optical field deviates in the upper half of the active layer (also known as the vertical deviation of the optical field), and the coupling of the optical field with the quantum well of the active layer will also deviate in the upper half of the active layer, thereby leading to the facts that the modal gain cannot be increased, the threshold current value cannot be reduced, the high operating speed (such as 10 Gb/s) cannot be achieved, and the operation cannot be performed at high temperature. As we know, a larger threshold current value means that a higher carrier density is required for the producing the population inversion, forming a laser, and causing the temperature to rise. When the carrier is injected into the active layer, an overflow is more likely to occur as the temperature rises, which also leads to the reduction of the coupling efficiency of the carrier in the active layer.

SUMMARY

In view of the problems of the prior art, it is a primary objective of the present disclosure to overcome the problems of the prior art by providing an edge emitting laser device. The present disclosure is based on the fact that the resistance of the p-type cladding layer of the edge emitting laser device is much greater than the resistance of the n-type cladding layer of the edge emitting laser device since most of the series resistance of the edge emitting laser device comes from the p-type cladding layer, therefore a part of the p-type cladding layer is converted into the n-type cladding layer to reduce the series resistance of the edge emitting laser device. The present disclosure is also based on the fact that a part of the p-type cladding layer is converted into the n-type cladding layer, such that the coupling of the optical field with the quantum well of the active layer tends to take place at the middle position of the thickness of the active layer, such that the lower half of the active layer can be utilized effectively and can compensate the vertical deviation of the optical field, so as to increase the modal gain and reduce the threshold current value. As a result, the edge emitting laser device can be operated at a high temperature condition and has a high operating speed. The present disclosure is further based on the fact that a part of the p-type cladding layer is converted into the n-type cladding layer, such that the optical field is relatively near the grating layer to achieve a better coupling efficiency of the optical field/grating and a lower threshold current value. As a result, the edge emitting laser device can be operated at the high temperature condition and has a high operating speed.

To achieve the foregoing and other objectives, the present disclosure discloses an edge emitting laser (EEL) device which includes: a substrate; a first n-type cladding layer, disposed at the top of the substrate; a grating layer, disposed at the top of the first n-type cladding layer; a spacer layer, disposed at the top of the grating layer; a lower confinement unit, disposed at the top of the spacer layer; an active layer, disposed at the top of the lower confinement unit; an upper confinement unit, disposed at the top of the active layer; a p-type cladding layer, disposed at the top of the upper confinement unit; a tunnel junction layer, disposed at the top of the p-type cladding layer; and a second n-type cladding layer, disposed at the top of the tunnel junction layer.

In another embodiment, the tunnel junction layer is also an etch stop layer.

In another embodiment, the tunnel junction layer is made of a material such as InGaAsP, AlGaInAs, InGaAs or AlInAs; or, the tunnel junction layer is made of a material such as InGaAsP, AlGaInAs, InGaAs, AlInAs or InP.

In another embodiment, an optical field of the EEL device is coupled with the active layer at the middle position of the thickness of the active layer.

In another embodiment of the present disclosure, an edge emitting laser (EEL) device includes: a substrate; a first n-type cladding layer, disposed at the top of the substrate; a lower confinement unit, disposed at the top of the first n-type cladding layer; an active layer, disposed at the top of the lower confinement unit; an upper confinement unit, disposed at the top of the active layer; a p-type cladding layer, disposed at the top of the upper confinement unit; a tunnel junction layer, disposed at the top of the p-type cladding layer; a lower second n-type cladding layer, disposed at the top of the tunnel junction layer; a grating layer, disposed at the top of the lower second n-type cladding layer; and a upper second n-type cladding layer, disposed at the top of the grating layer.

In another embodiment of the present disclosure, an edge emitting laser (EEL) device includes: a substrate; a first n-type cladding layer, disposed at the top of the substrate; a tunnel junction layer, disposed at the top of the first n-type cladding layer; a p-type cladding layer, disposed at the top of the tunnel junction layer; a grating layer, disposed at the top of the p-type cladding layer; a spacer layer, disposed at the top of the grating layer; a lower confinement unit, disposed at the top of the spacer layer; an active layer, disposed at the top of the lower confinement unit; an upper confinement unit, disposed at the top of the active layer; a lower second n-type cladding layer, disposed at the top of the upper confinement unit; an etch stop layer, disposed at the top of the lower second n-type cladding layer; and an upper second n-type cladding layer, disposed at the top of the etch stop layer.

DESCRIPTION OF THE EMBODIMENTS

This disclosure will now be described in more detail with reference to the accompanying drawings that show various embodiments of the invention.

Figure 1:
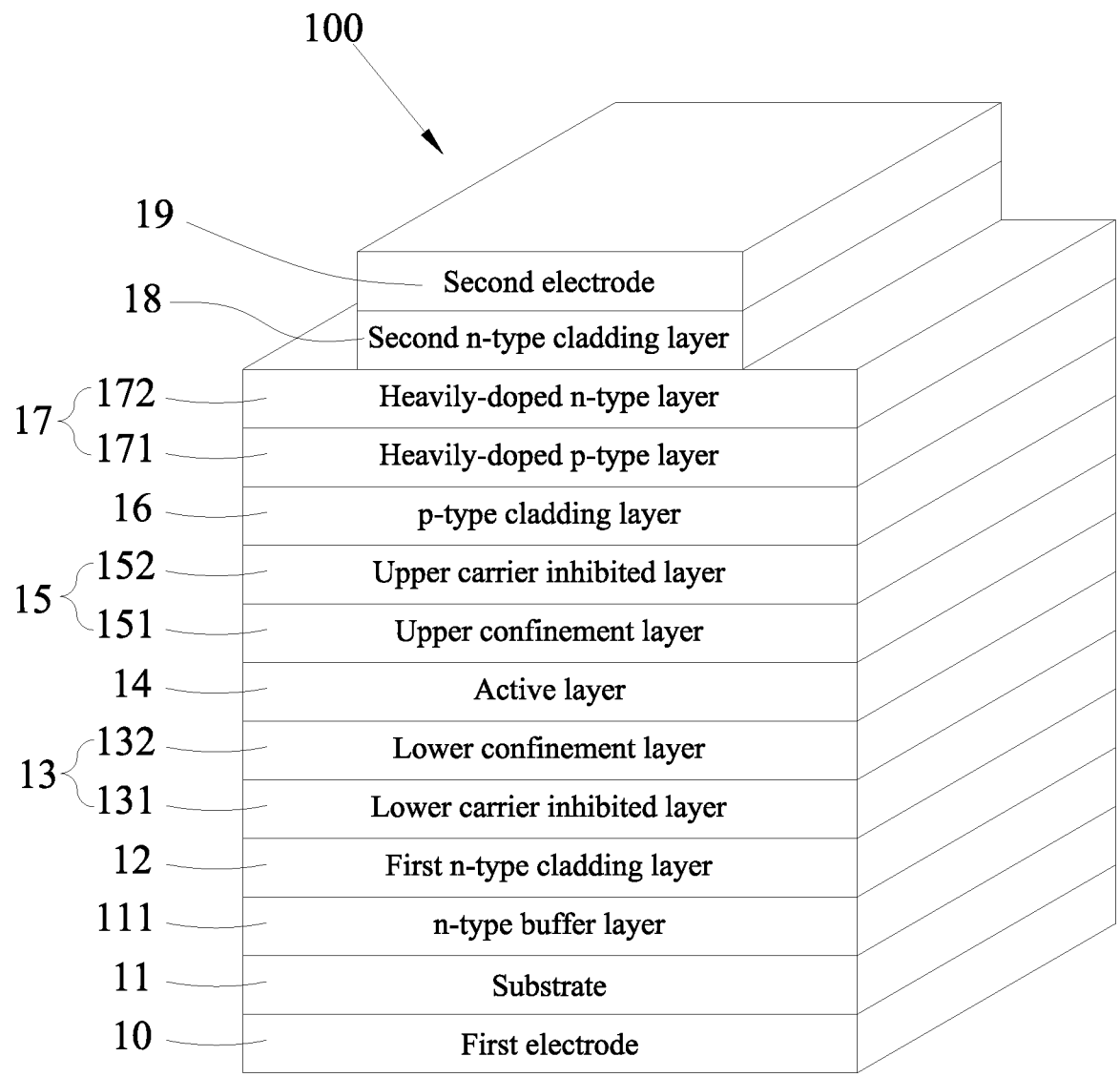
FIG. 1 is a schematic cross-sectional view of the structure of an EEL device in accordance with a first embodiment of this disclosure.

With reference to FIG. 1 for an edge emitting laser (EEL) device 100 in accordance with an embodiment of the present disclosure, the EEL device 100 is a FP laser device, and includes: a first electrode 10; a substrate 11, contacted with the first electrode 10; an n-type buffer layer 111, disposed on the upper surface of the substrate 11; a first n-type cladding layer 12, disposed at the top of the n-type buffer layer 111, and contactable with the upper surface of the n-type buffer layer 111; a lower confinement (which is a separated confinement hetero-structure, SCH) unit 13, disposed at the top of the first n-type cladding layer 12 and contactable with the upper surface of the first n-type cladding layer 12; an active layer 14, disposed at the top of the lower confinement unit 13, and contactable with the upper surface of the lower confinement unit 13; an upper confinement unit 15, disposed at the top of the active layer 14, and contactable with the upper surface of the active layer 14; a p-type cladding layer 16, disposed at the top of the upper confinement unit 15, and contactable with the upper surface of the upper confinement unit 15; a tunnel junction (TJ) layer 17, disposed at the top of the p-type cladding layer 16, and contactable with the upper surface of the p-type cladding layer 16; a second n-type cladding layer 18, disposed at the top of the tunnel junction layer 17, and contactable with the upper surface of the tunnel junction layer 17; and a second electrode 19, disposed at the top of the second n-type cladding layer 18, and contactable with the second n-type cladding layer 18. In other words, the EEL device 100 (or FP laser device) includes the substrate 11, the n-type buffer layer 111, the first n-type cladding layer 12, the lower confinement unit 13, the active layer 14, the upper confinement unit 15, the p-type cladding layer 16, the tunnel junction layer 17 and the second n-type cladding layer 18 sequentially arranged from bottom to top. The EEL device 100 further includes two contact layers such as the first electrode 10 and the second electrode 19 that can form an ohmic contact with the first n-type cladding layer 12 and the second n-type cladding layer 18 respectively to supply electric energy to the active layer and inject carriers. Basically, the two contact layers are n-type (ohmic) electrodes.

The two contact layers (the first electrode 10 and the second electrode 19) can be made of indium phosphide (InP), indium gallium arsenide (InGaAs), gold, silver, copper, iron, cobalt, nickel, titanium or their analogues and alloys, wherein the alloy can be zinc alloy or germanium alloy, and the first electrode 10 and the second electrode 19 can be made of the same material or different materials. The first electrode 10 can be formed by grinding a sulphur (S) doped InP layer substrate (with a doping concentration of approximately $1.0 \times 10^{18}$~$5.0 \times 10^{18}$ atoms/cm$^3$) to a thickness of approximately 120 μm, and then performing a backside metallization of the 80 μm germanium alloy. The second electrode 19 can be formed by grinding a tellurium (T) doped InGaAs layer or InP epitaxial layer (with a doping concentration greater than $1.0 \times 10^{19}$ atoms/cm$^3$) to a thickness of approximately 200 nm, and then processing the layer with an ohmic contact process.

The substrate 11 is doped to become conductive, wherein the substrate of this embodiment is made of indium phosphide (InP). The substrate 11 also includes the n-type buffer layer 111 made of the same material, and the n-type buffer layer 111 is an n-type semiconductor (wherein, this layer can be a part of the substrate 11) provided to ensure a smooth crystalline surface of the substrate 11 that facilitates the subsequent epitaxial growth of the layers such as the first n-type cladding layer 12 on the upper surface of the n-type buffer layer 111. In other words, the n-type buffer layer 111 and the first n-type cladding layer 12 are sequentially, upwardly and epitaxially grown on the upper surface of the substrate 11 by Molecular Beam Epitaxy (MBE) or Metal Organic Chemical Vapor Deposition (MOCVD).

For example, the first n-type cladding layer 12 and the second n-type cladding layer 18 are formed on the n-type cladding layer by the doped indium phosphide (InP) by silicon doping, and the p-type cladding layer 16 is formed by the doped indium phosphide (InP) by zinc doping.

The lower confinement unit 13 includes a lower carrier inhibited layer 131 and a lower confinement layer 132. The lower carrier inhibited layer 131 is disposed at the top of the first n-type cladding layer 12, and the lower carrier inhibited layer 131 can be contacted with the upper surface of the first n-type cladding layer 12. The lower confinement layer 132 is disposed on the upper surface of the lower carrier inhibited layer 131.

The active layer 14 is disposed at the top of the lower confinement layer 132 and contacted with the upper surface of the lower confinement layer 132. The active layer 14 can include one or more quantum well layers having a spectral gap wavelength, wherein each quantum well layer generates photons to emit laser beams under the operating wavelength. For example, the active layer 14 can include an indium phosphide (InP) layer, an aluminium indium arsenide (AlInAs) layer, an indium gallium arsenic phosphide (InGaAsP) layer, an indium gallium arsenide (InGaAs) layer or an aluminium gallium indium arsenide (AlGaInAs) layer. The active layer 14 can also include quantum holes or other device structures with appropriate luminescence properties, such as quantum dots or similar device structures. The quantum well layers, quantum holes or quantum dots are separated by known methods to generate the required laser beams.

The upper confinement unit 15 includes an upper confinement layer 151 and an upper carrier inhibited layer 152, wherein the upper confinement layer 151 is disposed at the top of the active layer 14 and can be contacted with the upper surface of the active layer 14; and the upper carrier inhibited layer 152 is disposed on the upper surface of the upper confinement layer 151.

The lower confinement layer 132 and the upper confinement layer 151 are made of aluminium gallium indium arsenide (AlGaInAs) or indium gallium arsenic phosphide (InGaAsP) with a high refractive index to confine the optical field in the horizontal direction. The lower confinement layer 132 and the upper confinement layer 151 are Graded-Index Separate Confinement Hetero-structures (GRINSCH) layer. The lower carrier inhibited layer 131 and the upper carrier inhibited layer 152 are made of aluminium indium arsenide (AlInAs), AlGaInAs or InGaAsP and provided for preventing carrier overflow, reducing the threshold current value and increasing the coupling rate of electrons/electron holes.

The lower confinement layer 132 and the upper confinement layer 151 cooperate with the first n-type cladding layer 12 and the p-type cladding layer 16 respectively to form a wavelength region with a large energy gap and a small refractive index relative to the active layer 14 for confining the carrier and the optical field.

The tunnel junction layer 17 can be a multilayer structure including a heavily-doped p-type layer 171 and a heavily-doped n-type layer 172. The heavily-doped p-type layer 171 of the tunnel junction layer 17 is adjacent to the p-type cladding layer 16, and the heavily-doped n-type layer 172 of the tunnel junction layer 17 is adjacent to the second n-type cladding layer 18. The tunnel junction layer 17 is made of a material matched with that of the p-type cladding layer 16. For example, the p-type cladding layer 16 is made of InP and the tunnel junction layer 17 is made of InGaAsP, AlGaInAs, InGaAs or AlInAs, or the tunnel junction layer 17 is made of InGaAsP, AlGaInAs, InGaAs, AlInAs or InP.

It is noteworthy that in the present disclosure, a part of the second n-type cladding layer 18 and the second electrode 19 is removed by etching to form a ridge structure, so that the tunnel junction layer 17 has the effect of stopping further etch during the etching process in order to form the predetermined ridge structure. In other words, the tunnel junction layer 17 is also an etch stop layer.

Table 1 lists the structural comparison of a traditional EEL device (or FP laser device) in accordance with Comparative Example 1.

TABLE 1

(Comparative Example 1)

| Layer | Description | Material | Thickness (nm) | Dopant | Dopant Content (atoms/cm$^3$) | Type |
|---|---|---|---|---|---|---|
| 1 | First electrode | InP | 200 | S | $1.0 \times 10^{18}$~$5.0 \times 10^{18}$ | n |
| 2 | Substrate | InP | 350000 | S | $1.0 \times 10^{18}$~$5.0 \times 10^{18}$ | n |
| 3 | n-type buffer layer | InP | 500 | Si | $1.0 \times 10^{18}$ | n |
| 4 | n-type cladding layer | InP | 100 | Si | $1.0 \times 10^{18}$ | n |
| 5 | Lower carrier inhibited layer | AlInAs | 140 | Si | $5.0 \times 10^{17}$ | n |
| 6 | Lower confinement layer | AlGaInAs | 50 | — | — | — |
| 7 | Active layer | AlGaInAs | *Note | — | — | — |
| 8 | Upper confinement layer | AlGaInAs | 50 | — | — | — |
| 9 | Upper carrier inhibited layer | AlInAs | 50 | — | — | — |
| 10 | p-type cladding layer | InP | 50 | Zn | $5.0 \times 10^{17}$ | p |
| 11 | Etch stop layer | InGaAsP | 25 | Zn | $1.0 \times 10^{18}$ | p |
| 12 | p-type cladding layer | InP | 1500 | Zn | $7.0 \times 10^{17}$~$1.5 \times 10^{18}$ | p |
| 13 | Second electrode | InGaAs | 200 | Zn | Greater than $1.0 \times 10^{19}$ | p |

*Note:
The thickness of the active layer can be designed according to the range of light emitting wavelength for operating the EEL device.

Table 2 lists the structural comparison of an EEL device 30 (or FP laser device) in accordance with the first embodiment of the present disclosure.

TABLE 2

(First Embodiment)

| Layer | Description | Material | Thickness (nm) | Dopant | Dopant Content (atoms/cm$^3$) | Type |
|---|---|---|---|---|---|---|
| 1 | First electrode 10 | InP | 200 | S | $1.0 \times 10^{18}$~$5.0 \times 10^{18}$ | n |
| 2 | Substrate 11 | InP | 350000 | S | $1.0 \times 10^{18}$~$5.0 \times 10^{18}$ | n |
| 3 | n-type buffer layer 111 | InP | 500 | Si | $1.0 \times 10^{18}$ | n |
| 4 | First n-type cladding layer 12 | InP | 100 | Si | $1.0 \times 10^{18}$ | n |
| 5 | Lower carrier inhibited layer 131 | AlInAs | 140 | Si | $5.0 \times 10^{17}$ | n |
| 6 | Lower confinement layer 132 | AlGaInAs | 50 | — | — | — |
| 7 | Active layer 14 | AlGaInAs | *Note | — | — | — |
| 8 | Upper confinement layer 151 | AlGaInAs | 50 | — | — | — |
| 9 | Upper carrier inhibitor layer 152 | AlInAs | 50 | — | — | — |
| 10 | p-type cladding layer 16 | InP | 50 | Zn | $5.0 \times 10^{17}$ | p |
| 11 | Tunnel junction layer 17 (heavily-doped p-type layer 171) | InGaAsP | 15 | C | Greater than $1.0 \times 10^{19}$ | p |
|  | Tunnel junction layer 17 (heavily-doped n-type layer 172) | InGaAsP | 15 | Te | Greater than $1.0 \times 10^{19}$ | n |

TABLE 2-continued (First Embodiment)

| Layer | Description | Material | Thickness (nm) | Dopant | Dopant Content (atoms/cm$^3$) | Type |
|---|---|---|---|---|---|---|
| 12 | Second n-type cladding layer 18 | InP | 1500 | Si | $7.0 \times 10^{17} \sim 1.5 \times 10^{18}$ | n |
| 13 | Second electrode 19 | InGaAs | 200 | Te | Greater than $1.0 \times 10^{19}$ | n |

*Note:
The thickness of the active layer can be designed according to the range of light emitting wavelength for operating the EEL device.

Figure 2A:
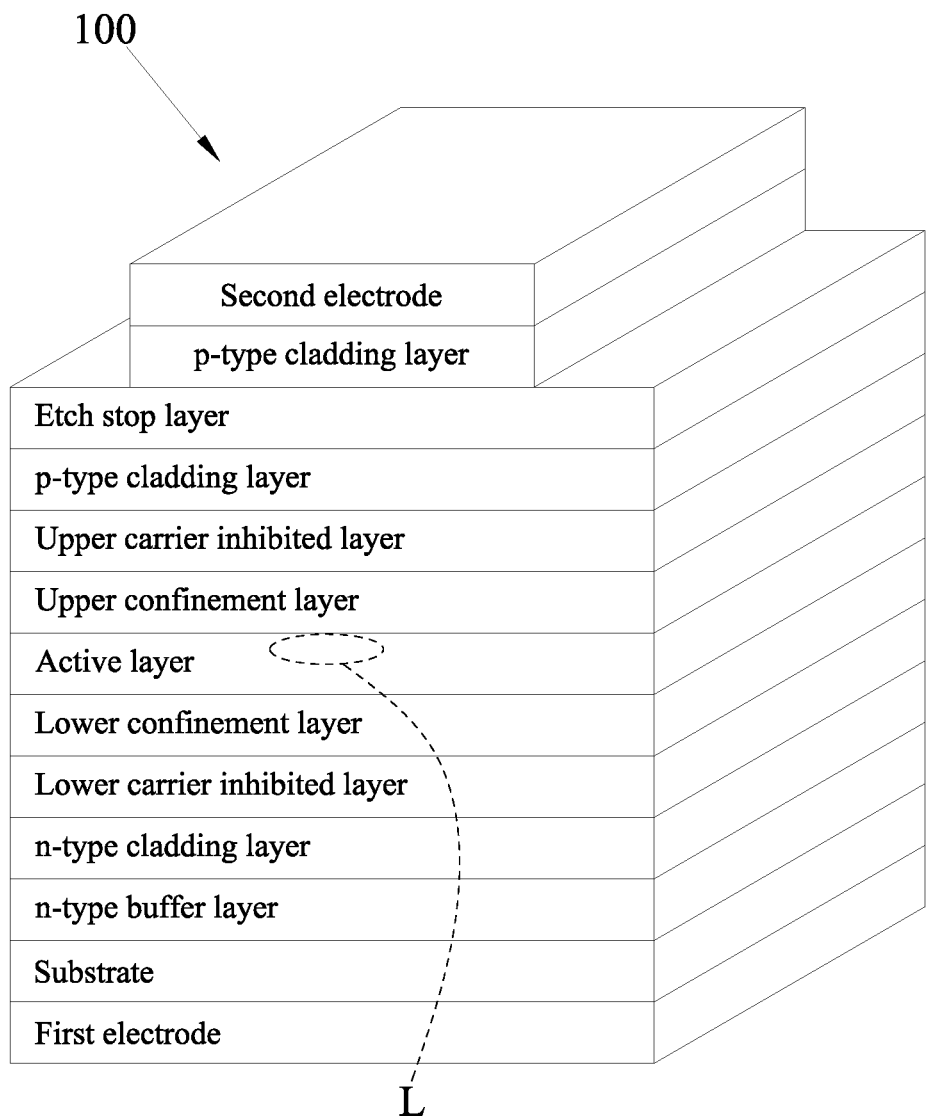
FIG. 2A is a schematic view of an optical field disposed at the upper half of an active layer of a traditional EEL device in accordance with a first comparative example of the present invention.
Figure 2B:
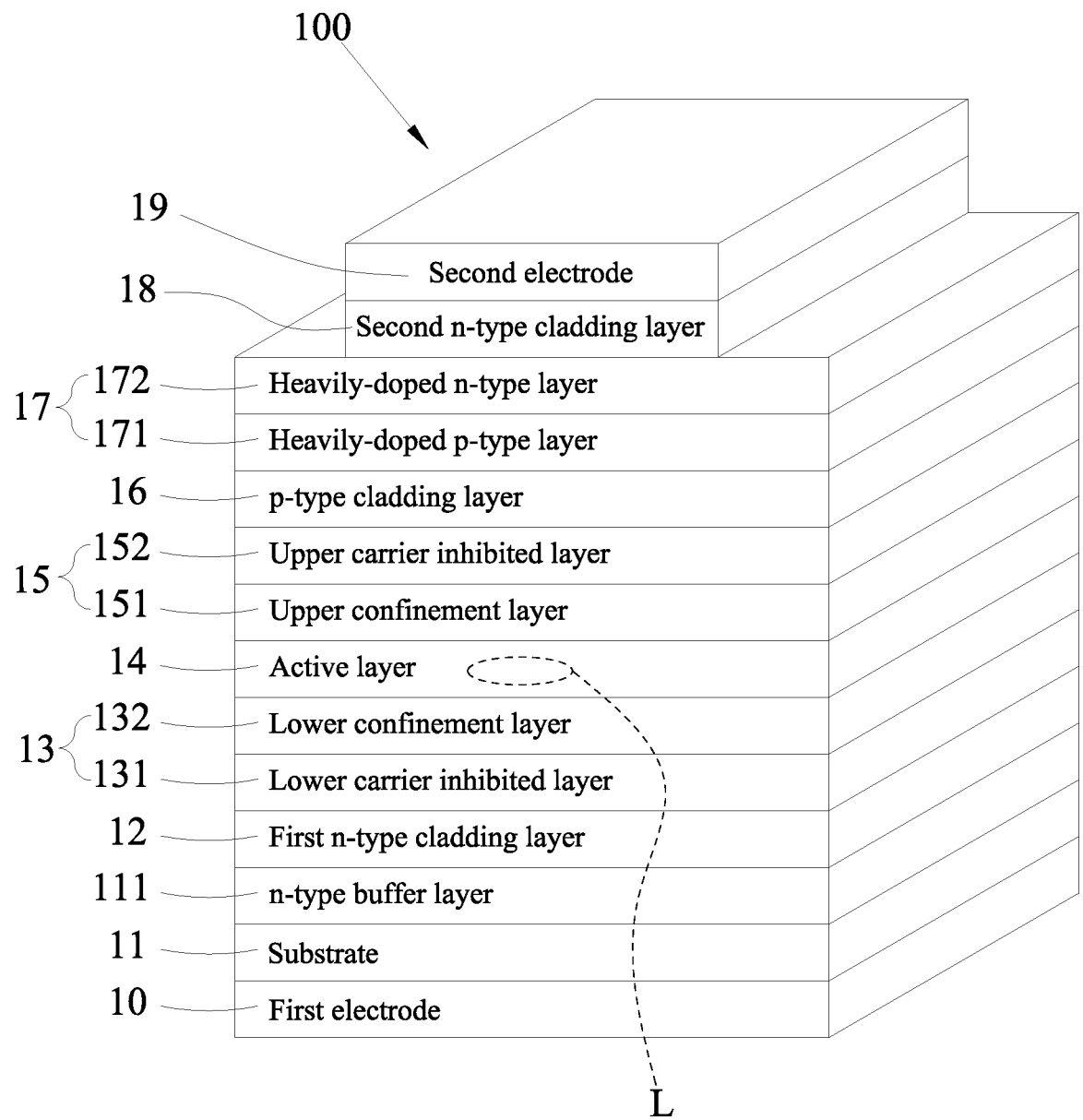
FIG. 2B is a schematic view of an optical field disposed at a middle position of an active layer of an EEL device in accordance with the first embodiment of the present disclosure.

Compared with the Comparative Example 1, the first embodiment has the following advantages: (1) In the 11$^{th}$ layer, the tunnel junction layer 17 of the first embodiment adopts the method of converting the p-type cladding layer (the 12$^{th}$ layer) of the Comparative Example 1 into the second n-type cladding layer 18 (the 12$^{th}$ layer) of the first embodiment, such that the first embodiment only has the p-type cladding layer 16 (thickness 50 nm) and the heavily-doped p-type layer 171 (15 nm) of the tunnel junction layer 17 which are p-type semiconductors with a total thickness of 65 nm (65 nm=50 nm+15 nm), but the Comparative Example 1 has the p-type cladding layer (50 nm), the etch stop layer (25 nm), the p-type cladding layer (1500 nm) and the second electrode (200 nm) which are p-type semiconductors with a total thickness of 1775 nm (1775 nm=50 nm+25 nm+1500 nm+200 nm), and the total thickness (65 nm) of the p-type semiconductor of the first embodiment is equal to 3.66% of the total thickness (1775 nm) of the p-type semiconductor of the Comparative Example 1. Since most of the series resistances come from the p-type semiconductor, therefore the first embodiment has a lower series resistance than the Comparative Example 1. (2) Based on the previous discussion in (1), in the 13th layer, the first embodiment adopts the n-type electrode, so that the first embodiment has a lower series resistance, and the Comparative Example 1 adopts the p-type electrode with a higher series resistance. (3) Based on the previous discussion as described in (1), the electron holes of the Comparative Example 1 migrate sequentially through the second electrode (200 nm), the p-type cladding layer (1500 nm), the etch stop layer (25 nm) and the p-type semiconductor of the p-type cladding layer (50 nm) with a total thickness of 1775 nm. Since the carrier in the n-type semiconductor has a mobility greater than the mobility of the carrier in the p-type semiconductor, therefore the electrons/electron holes of the Comparative Example 1 are coupled at the upper half of the active layer (the 7$^{th}$ layer) to emit light, such that most of the optical field L is deviated at the upper half of the active layer (Refer to FIG. 2A), and the lower half of the active layer cannot be utilized effectively, thereby leading to the results that the modal gain cannot be increased, the threshold current value cannot be reduced, the high operating speed cannot be achieved and the operation cannot be performed at high temperature. However, the electron holes of the first embodiment migrate through a total thickness (only 65 nm) of the p-type semiconductor, which is equal to 3.66% of the total thickness 1775 nm of the p-type semiconductor of the Comparative Example 1, such that the optical field L of the first embodiment tends to be coupled with the quantum wells of the active layer 14 more at the middle position of the thickness of the active layer 14 (Refer to FIG. 2B), and both of the upper half and the lower half of the active layer 14 can be utilized effectively, and the vertical deviation of the optical field can be compensated to achieve the effects of increasing the modal gain, reducing the threshold current value, making the edge emitting laser device able to be operated at a high temperature condition, and providing a high operating speed.

Figure 3:
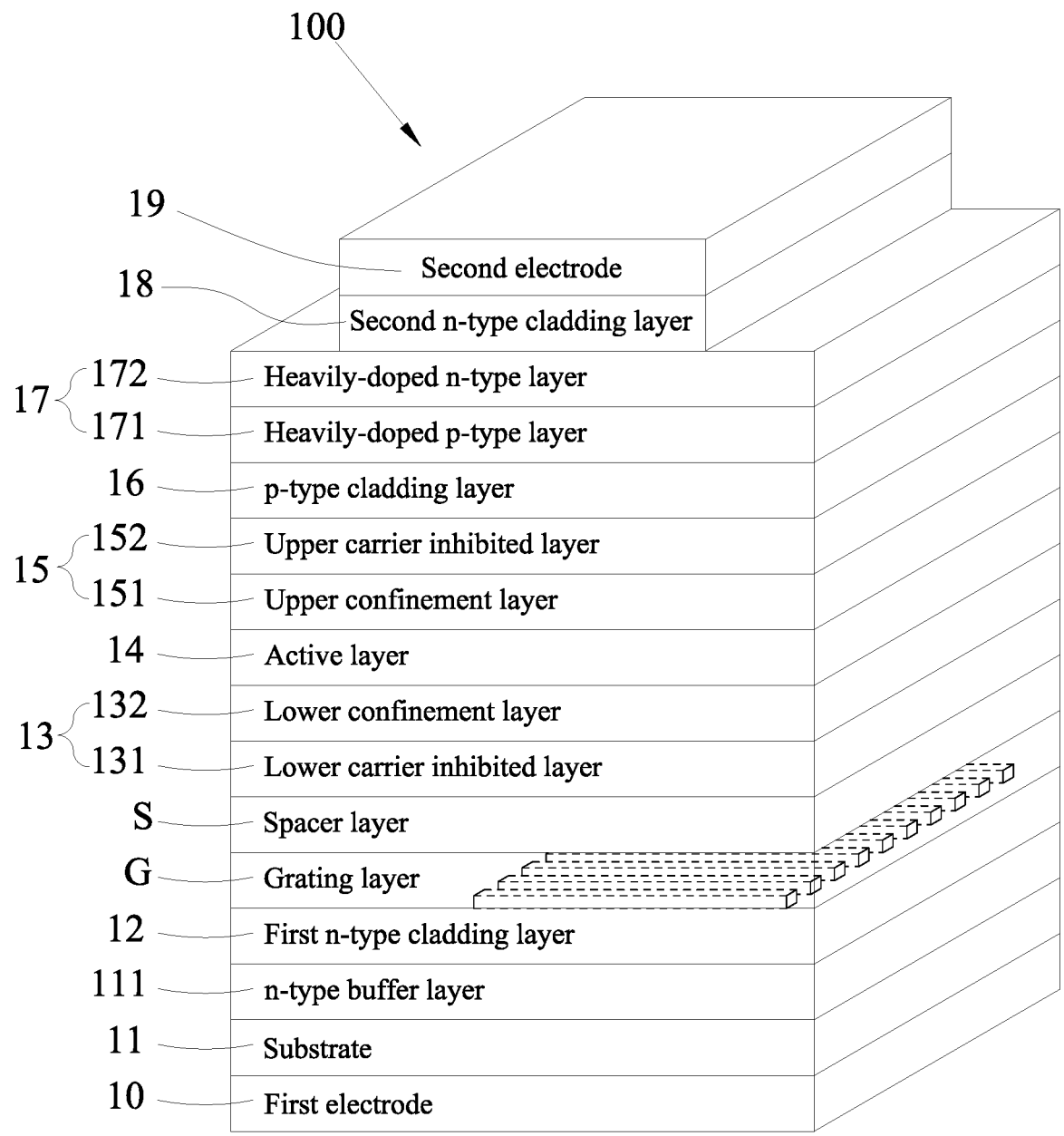
FIG. 3 is a cross-sectional view of the structure of an EEL device including a spacer layer and a grating layer in accordance with a second embodiment of the present disclosure.

In another implementation mode of the present disclosure, the edge emitting laser (EEL) device 100 is a DFB laser device with the aforementioned structure of the FP laser and further including a spacer layer S and a grating layer G (Refer to FIG. 3), wherein the grating layer G is disposed at the top of the first n-type cladding layer 12 and can be contacted with the upper surface of the first n-type cladding layer 12; the spacer layer S is disposed at the top of the grating layer G and can be contacted with the upper surface of the grating layer G; and the lower carrier inhibited layer 131 of the lower confinement unit 13 is disposed at the top of the spacer layer S and can be contacted with the upper surface of the spacer layer S. In other words, the EEL device 100 (DFB laser device) includes: the substrate 11, the n-type buffer layer 111, the first n-type cladding layer 12, the grating layer G, the spacer layer S, the lower confinement unit 13, the active layer 14, the upper confinement unit 15, the p-type cladding layer 16, the tunnel junction layer 17 and the second n-type cladding layer 18, which are arranged sequentially from bottom to top. The EEL device 100 (DFB laser device) comprises: the substrate 11; the first n-type cladding layer 12 disposed at the top of the substrate 11; the grating layer G disposed at the top of the first n-type cladding layer 12; the spacer layer S disposed at the top of the grating layer G; the lower confinement unit 13 disposed at the top of the spacer layer S; the active layer 14 disposed at the top of the lower confinement unit 13; the upper confinement unit 15 disposed at the top of the active layer 14; the p-type cladding layer 16 disposed at the top of the upper confinement unit 15; the tunnel junction layer 17 disposed at the top of the p-type cladding layer 16; and the second n-type cladding layer 18 disposed at the top of the tunnel junction layer 17.

Table 3 below lists the structural comparison of the structure in accordance with the Comparative Example 2 with the structure of the traditional EEL device (DFB laser device).

TABLE 3

(Comparative Example 2)

| Layer | Description | Material | Thickness (nm) | Dopant | Dopant Content (atoms/cm$^3$) | Type |
|---|---|---|---|---|---|---|
| 1 | First electrode | InP | 200 | S | $1.0 \times 10^{18}$~$5.0 \times 10^{18}$ | n |
| 2 | Substrate | InP | 350000 | S | $1.0 \times 10^{18}$~$5.0 \times 10^{18}$ | n |
| 3 | n-type buffer layer | InP | 500 | Si | $1.0 \times 10^{18}$ | n |
| 4 | n-type cladding layer | InP | 100 | Si | $1.0 \times 10^{18}$ | n |
| 4-1 | Grating layer | InGaAsP | 35 | Si | $1.0 \times 10^{18}$ | n |
| 4-2 | Spacer layer | InP | 150 | Si | $1.0 \times 10^{17}$ | n |
| 5 | Lower carrier inhibited layer | AlInAs | 50 | Si | $5.0 \times 10^{17}$ | n |
| 6 | Lower confinement layer | AlGaInAs | 50 | — | — | — |
| 7 | Active layer | AlGaInAs | *Note | — | — | — |
| 8 | Upper confinement layer | AlGaInAs | 50 | — | — | — |
| 9 | Upper carrier inhibited layer | AlInAs | 50 | — | — | — |
| 10 | p-type cladding layer | InP | 50 | Zn | $5.0 \times 10^{17}$ | p |
| 11 | Etch stop layer | InGaAsP | 25 | Zn | $1.0 \times 10^{18}$ | p |
| 12 | p-type cladding layer | InP | 1500 | Zn | $7.0 \times 10^{17}$~$1.5 \times 10^{18}$ | p |
| 13 | Second electrode | InGaAs | 200 | Zn | Greater than $1.0 \times 10^{19}$ | p |

*Note:
The thickness of the active layer can be designed according to the range of light emitting wavelength for operating the EEL device.

Table 4 lists the structural comparison of an EEL device (or DFB laser device) in accordance with the second embodiment of the present disclosure.

TABLE 4

(Second Embodiment)

| Layer | Description | Material | Thickness (nm) | Dopant | Dopant Content (atoms/cm$^3$) | Type |
|---|---|---|---|---|---|---|
| 1 | First electrode 10 | InP | 200 | S | $1.0 \times 10^{18}$~$5.0 \times 10^{18}$ | n |
| 2 | Substrate 11 | InP | 350000 | S | $1.0 \times 10^{18}$~$5.0 \times 10^{18}$ | n |
| 3 | n-type buffer layer 111 | InP | 500 | Si | $1.0 \times 10^{18}$ | n |
| 4 | First n-type cladding layer 12 | InP | 100 | Si | $1.0 \times 10^{18}$ | n |
| 4-1 | Grating layer G | InGaAsP | 35 | Si | $1.0 \times 10^{18}$ | n |
| 4-2 | Spacer layer S | InP | 150 | Si | $1.0 \times 10^{18}$ | n |
| 5 | Lower carrier inhibited layer 131 | AlInAs | 50 | Si | $5.0 \times 10^{17}$ | n |
| 6 | Lower confinement layer 132 | AlGaInAs | 50 | — | — | — |
| 7 | Active layer 14 | AlGaInAs | *Note | — | — | — |
| 8 | Lower confinement layer 151 | AlGaInAs | 50 | — | — | — |
| 9 | Upper carrier inhibited layer 152 | AlInAs | 50 | — | — | — |
| 10 | p-type cladding layer 16 | InP | 50 | Zn | $5.0 \times 10^{17}$ | p |

TABLE 4-continued (Second Embodiment)

| Layer | Description | Material | Thickness (nm) | Dopant | Dopant Content (atoms/cm$^3$) | Type |
|---|---|---|---|---|---|---|
| 11 | Tunnel junction layer 17 (heavily-doped p-type layer 171) | InGaAsP | 15 | C | Greater than $1.0 \times 10^{19}$ | p |
|  | Tunnel junction layer 17 (heavily-doped n-type layer 172) | InGaAsP | 15 | Te | Greater than $1.0 \times 10^{19}$ | n |
| 12 | Second n-type cladding layer 18 | InP | 1500 | Si | $7.0 \times 10^{17} \sim 1.5 \times 10^{18}$ | n |
| 13 | Second electrode 19 | InGaAs | 200 | Te | Greater than $1.0 \times 10^{19}$ | n |

*Note:
The thickness of the active layer can be designed according to the range of light emitting wavelength for operating the EEL device.

Similar to the aforementioned discussion of the FP laser device of Comparative Example 1 of Table 1 and the first embodiment of Table 2, and the comparison with the DFB laser device of the Comparative Example 2, the second embodiment also has the following advantages: (1) In the 11$^{th}$ layer, the tunnel junction layer 17 of the second embodiment adopts the method of converting the p-type cladding layer (the 12$^{th}$ layer) of the Comparative Example 2 into the second n-type cladding layer 18 (the 12$^{th}$ layer) of the second embodiment, such that the second embodiment only has the p-type cladding layer 16 (thickness 50 nm) and the heavily-doped p-type layer 171 (15 nm) of the tunnel junction layer 17 which are p-type semiconductors with a total thickness of 65 nm, but the Comparative Example 2 has the p-type cladding layer (50 nm), the etch stop layer (25 nm), the p-type cladding layer (1500 nm) and the second electrode (200 nm) which are p-type semiconductors with a total thickness of 1775 nm, and the total thickness (65 nm) of the p-type semiconductor of the second embodiment is equal to 3.66% of the total thickness (1775 nm) of the p-type semiconductor of the Comparative Example 2. Since most of the series resistances come from the p-type semiconductor, therefore the second embodiment has a lower series resistance than the Comparative Example 2. (2) Based on the previous discussion in (1), in the 13th layer, the second embodiment adopts the n-type electrode, so that the second embodiment has a lower series resistance, and the Comparative Example 2 adopts the p-type electrode with a higher series resistance. (3) Based on the previous description in (1), the electron holes of the Comparative Example 2 migrate sequentially through the second electrode (200 nm), the p-type cladding layer (1500 nm), the etch stop layer (25 nm) and the p-type semiconductor of the p-type cladding layer (50 nm) with a total thickness of 1775 nm. Since the carrier in the n-type semiconductor has a mobility greater than the mobility of the carrier in the p-type semiconductor, therefore the electrons/electron holes of the Comparative Example 2 are coupled at the upper half of the active layer (the 7$^{th}$ layer) to emit light, such that most of the optical field L is deviated at the upper half of the active, and the lower half of the active layer cannot be utilized effectively, thereby leading to the results that the modal gain cannot be increased, the threshold current value cannot be reduced, the high operating speed cannot be achieved and the operation cannot be performed at high temperature. However, the electron holes of the second embodiment migrate through a total thickness (only 65 nm) of the p-type semiconductor, which is equal to 3.66% of the total thickness 1775 nm of the p-type semiconductor of the Comparative Example 2, such that the optical field L of the second embodiment tends to be coupled with the quantum wells of the active layer 14 more at the middle position of the thickness of the active layer 14, and both of the upper half and the lower half of the active layer 14 can be utilized effectively, and the vertical deviation of the optical field can be compensated to achieve the effects of increasing the modal gain, reducing the threshold current value, making the edge emitting laser device able to be operated at a high temperature condition, and providing a high operating speed.

Figure 4:
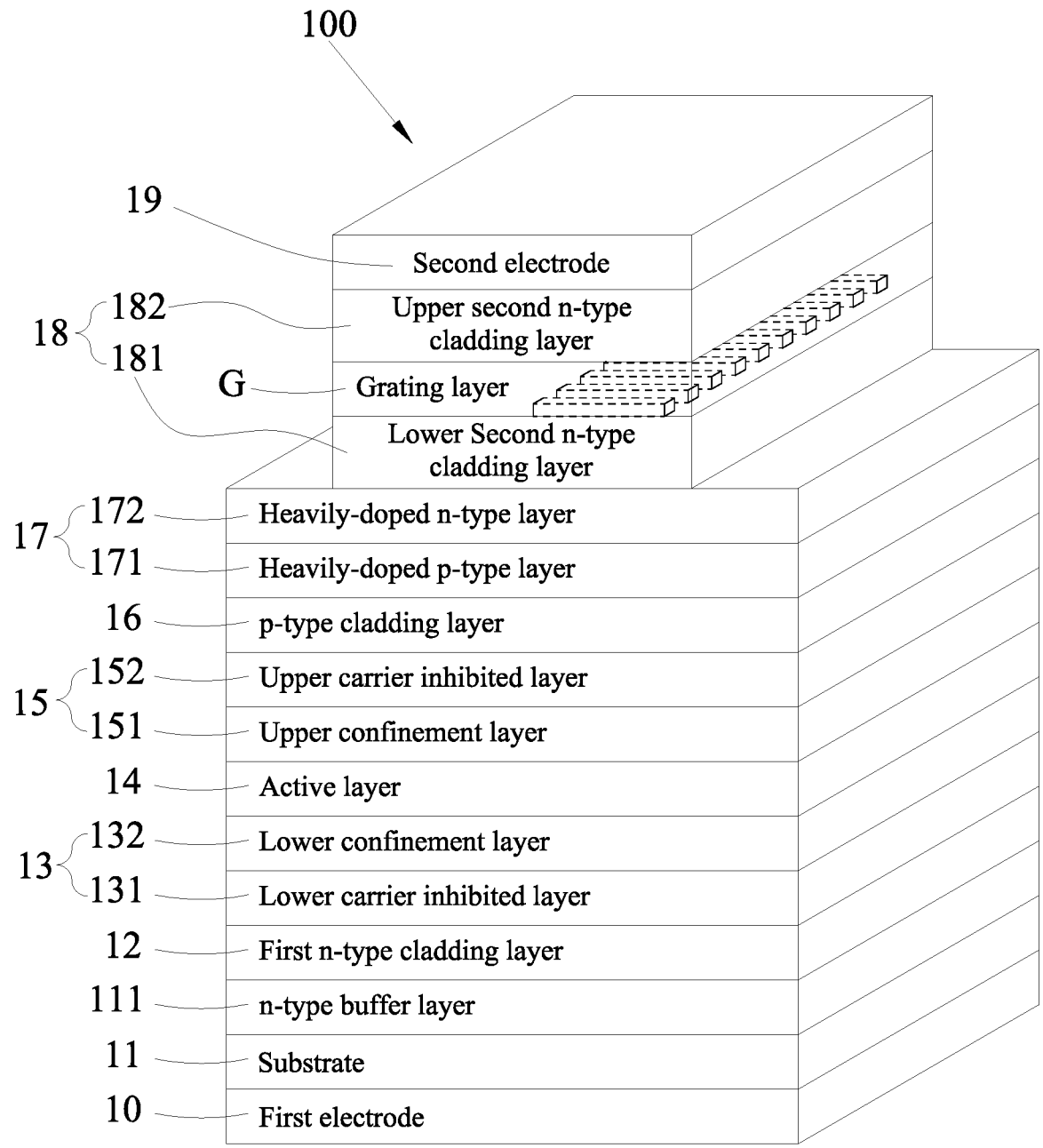
FIG. 4 is a cross-sectional view of the structure of an EEL device including a grating layer in accordance with a third embodiment of the present disclosure.

With reference to FIG. 4 for another implementation mode of an edge emitting laser (EEL) device of the present disclosure, the edge emitting laser (EEL) device 100 is a DFB laser device with the aforementioned structure of the FP laser and further including a grating layer G. In FIG. 4, the second n-type cladding layer 18 is divided into a lower second n-type cladding layer 181 and an upper second n-type cladding layer 182, and the grating layer G is formed between the lower second n-type cladding layer 181 and the upper second n-type cladding layer 182 by epitaxy, and an etching method is used to remove a part of the lower second n-type cladding layer 181, the grating layer G, the upper second n-type cladding layer 182 and contact layer (the second electrode 19) to form a ridge structure, and the tunnel junction layer 17 (etch stop layer) can stop further etching. The EEL device 100 (DFB laser device) includes: the substrate 11, the n-type buffer layer 111, the first n-type cladding layer 12, the grating layer G, the lower confinement unit 13, the active layer 14, the upper confinement unit 15, the p-type cladding layer 16, the tunnel junction layer 17, the lower second n-type cladding layer 181, the grating layer G and the upper second n-type cladding layer 182, which are arranged sequentially from bottom to top. The EEL device 100 (DFB laser device) comprises: the substrate 11; the first n-type cladding layer 12 disposed at the top of the substrate 11; the lower confinement unit 13 disposed at the top of the first n-type cladding layer 12; the active layer 14 disposed at the top of the lower confinement unit 13; the upper confinement unit 15 disposed at the top of the active layer 14; the p-type cladding layer 16 disposed at the top of the upper confinement unit 15; the tunnel junction layer 17 disposed at the top of the p-type cladding layer 16; the lower second n-type cladding layer 181 disposed at the top of the tunnel junction layer 17; the grating layer G disposed at the top of the lower second n-type cladding layer 181; and the upper second n-type cladding layer 182 disposed at the top of the grating layer G.

Table 5 below lists the structural comparison of the Comparative Example 3 with the traditional EEL device (DFB laser device).

TABLE 5

(Comparative Example 3)

| Layer | Description | Material | Thickness (nm) | Dopant | Dopant Content (atoms/cm$^3$) | Type |
|---|---|---|---|---|---|---|
| 1 | First electrode | InP | 200 | S | $1.0 \times 10^{18} \sim 5.0 \times 10^{18}$ | n |
| 2 | Substrate | InP | 350000 | S | $1.0 \times 10^{18} \sim 5.0 \times 10^{18}$ | n |
| 3 | n-type buffer layer | InP | 500 | Si | $1.0 \times 10^{18}$ | n |
| 4 | n-type cladding layer | InP | 100 | Si | $1.0 \times 10^{18}$ | n |
| 5 | Lower carrier inhibited layer | AlInAs | 50 | Si | $5.0 \times 10^{17}$ | n |
| 6 | Lower confinement layer | AlGaInAs | 50 | — | — | — |
| 7 | Active layer | AlGaInAs | *Note | — | — | — |
| 8 | Upper confinement layer | AlGaInAs | 50 | — | — | — |
| 9 | Upper carrier inhibited layer | AlInAs | 50 | — | — | — |
| 10 | p-type cladding layer | InP | 20 | Zn | $5.0 \times 10^{17}$ | p |
| 11 | Etch stop layer | InGaAsP | 15 | Zn | $1.0 \times 10^{18}$ | p |
| 12 | p-type cladding layer | InP | 25 | Zn | $1.0 \times 10^{18}$ | p |
| 12-1 | Grating layer | InGaAsP | 15 | Zn | $1.0 \times 10^{18}$ | p |
| 13 | p-type cladding layer | InP | 1500 | Zn | $7.0 \times 10^{17} \sim 1.5 \times 10^{18}$ | p |
| 14 | Second electrode | InGaAs | 200 | Zn | Greater than $1.0 \times 10^{19}$ | p |

*Note:
The thickness of the active layer can be designed according to the range of light emitting wavelength for operating the EEL device.

Table 6 lists the structural comparison of an EEL device (or DFB laser device) in accordance with the third embodiment of the present disclosure.

TABLE 6

(Third Embodiment)

| Layer | Description | Material | Thickness (nm) | Dopant | Dopant Content (atoms/cm$^3$) | Type |
|---|---|---|---|---|---|---|
| 1 | First electrode 10 | InP | 200 | S | $1.0 \times 10^{18} \sim 5.0 \times 10^{18}$ | n |
| 2 | Substrate 11 | InP | 350000 | S | $1.0 \times 10^{18} \sim 5.0 \times 10^{18}$ | n |
| 3 | n-type buffer layer 111 | InP | 500 | Si | $1.0 \times 10^{18}$ | n |
| 4 | First n-type cladding layer 12 | InP | 100 | Si | $1.0 \times 10^{18}$ | n |
| 5 | lower carrier inhibited layer 131 | AlInAs | 50 | Si | $5.0 \times 10^{17}$ | n |
| 6 | Lower confinement layer 132 | AlGaInAs | 50 | — | — | — |
| 7 | Active layer 14 | AlGaInAs | *Note | — | — | — |
| 8 | Upper confinement layer 151 | AlGaInAs | 50 | — | — | — |
| 9 | Upper carrier inhibited layer 152 | AlInAs | 50 | — | — | — |
| 10 | p-type cladding layer 16 | InP | 20 | Zn | $5.0 \times 10^{17}$ | p |
| 11 | Tunnel junction layer 17 (heavily-doped p-type layer 171) | InGaAsP | 15 | C | Greater than $1.0 \times 10^{19}$ | p |

TABLE 6-continued (Third Embodiment)

| Layer | Description | Material | Thickness (nm) | Dopant | Dopant Content (atoms/cm³) | Type |
|---|---|---|---|---|---|---|
| | Tunnel junction layer 17 (heavily-doped n-type layer 172) | InGaAsP | 15 | Te | Greater than $1.0 \times 10^{19}$ | n |
| 12 | Lower second n-type cladding layer 181 | InP | 25 | Si | $1.0 \times 10^{18}$ | n |
| 12-1 | Grating layer G | InGaAsP | 15 | Si | $1.0 \times 10^{18}$ | n |
| 13 | Upper second n-type cladding layer 182 | InP | 1500 | Si | $7.0 \times 10^{17}$~$1.5 \times 10^{18}$ | n |
| 14 | Second electrode 19 | InGaAs | 200 | Te | Greater than $1.0 \times 10^{19}$ | n |

*Note:
The thickness of the active layer can be designed according to the range of light emitting wavelength for operating the EEL device.

Similar to the aforementioned discussion of the FP laser device of the Comparative Example 1 of Table 1 and the first embodiment of Table 2 and the comparison with the DFB laser device of the Comparative Example 3, the third embodiment also has the following advantages: (1) In the 11$^{th}$ layer, the tunnel junction layer 17 of the third embodiment adopts the method of converting the p-type cladding layer (the 12$^{th}$ layer and the 13th layer) of the Comparative Example 3 into the second n-type cladding layer 18 (the lower second n-type cladding layer 181 of the 12$^{th}$ layer and the upper second n-type cladding layer 182 of the 13th layer) of the third embodiment, such that the third embodiment only has the p-type cladding layer 16 (thickness 20 nm) and the heavily-doped p-type layer 171 (15 nm) of the tunnel junction layer 17 which are p-type semiconductors with a total thickness of 35 nm, but the Comparative Example 3 has the p-type cladding layer (20 nm), the etch stop layer (15 nm), the p-type cladding layer (25 nm), the grating layer (15 nm), the p-type cladding layer (1500 nm) and the second electrode (200 nm) which are p-type semiconductors with a total thickness of 1775 nm, and the total thickness 35 nm of the p-type semiconductor of the third embodiment is equal to 1.97% of the total thickness of the p-type semiconductors of the Comparative Example 3. Since most of the series resistances come from the p-type semiconductor, therefore the third embodiment has a lower series resistance than the Comparative Example 3. (2) Based on the previous discussion in (1), in the 12$^{th}$ layer and the 13$^{th}$ layer, the third embodiment adopts the n-type electrode, so that the third embodiment has a lower series resistance, and the Comparative Example 3 adopting the p-type electrode has a higher series resistance. (3) Based on the previous description in (1), the electron holes of the Comparative Example 3 migrate sequentially through the second electrode (200 nm), the p-type cladding layer (1500 nm), the grating layer (15 nm), the p-type cladding layer (25 nm), the etch stop layer (25 nm) and the p-type semiconductor of the p-type cladding layer (20 nm) with a total thickness of 1775 nm. Since the carrier in the n-type semiconductor has a mobility greater than the mobility of the carrier in the p-type semiconductor, therefore the electrons/electron holes of the Comparative Example 3 are coupled at the upper half of the active layer (the 7$^{th}$ layer) to emit light, such that most of the optical field L is deviated at the upper half of the active layer, and the lower half of the active layer cannot be utilized effectively, thereby leading to the results that the modal gain cannot be increased, the threshold current value cannot be reduced, the high operating speed cannot be achieved and the operation cannot be performed at high temperature. However, the electron holes of the third embodiment migrate through a total thickness (only 35 nm) of the p-type semiconductor which is 1.97% of the total thickness 1775 nm, such that the optical field L of the third embodiment tends to be coupled with the quantum wells of the active layer 14 more at the middle position of the thickness of the active layer 14, and both of the upper half and the lower half of the active layer 14 can be utilized effectively, and the vertical deviation of the optical field can be compensated to achieve the effects of increasing the modal gain, reducing the threshold current value, making the edge emitting laser device able to be operated at a high temperature condition, and providing a high operating speed.

Figure 5:
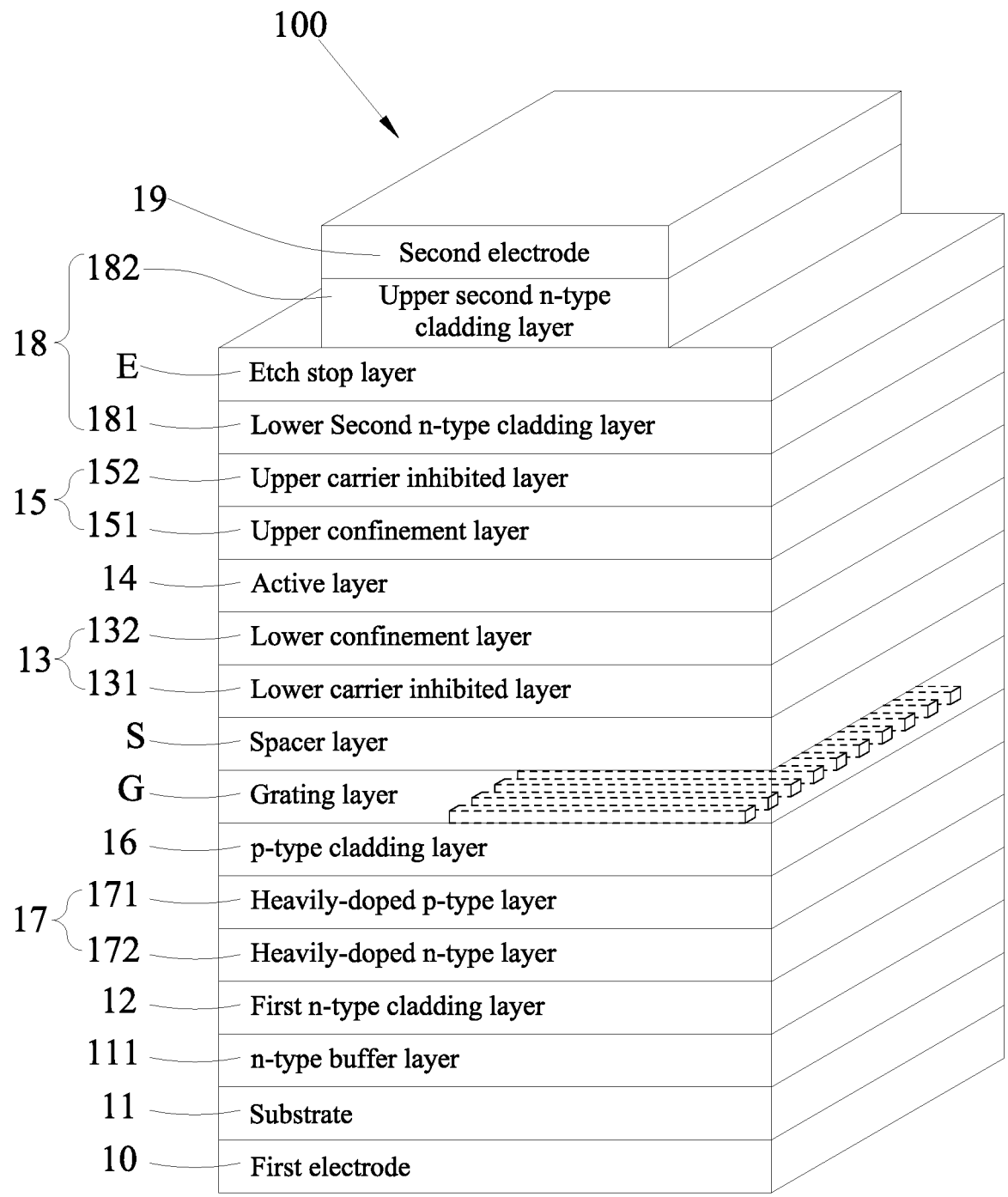
FIG. 5 is a cross-sectional view of the P-i-N arranged structure of an EEL device in accordance with a fourth embodiment of the present disclosure.

In another implementation mode of the present disclosure, an edge emitting laser (EEL) device 100 is a DFB laser device (refer to FIG. 5), and the EEL device 100 (DFB laser device) includes: the first electrode 10, the substrate 11, the n-type buffer layer 111, the first n-type cladding layer 12, the tunnel junction layer 17 (including the heavily-doped n-type layer 172 and the heavily-doped p-type layer 171 arranged sequentially from bottom to top), the p-type cladding layer 16, the grating layer G, the spacer layer S, the lower confinement unit 13 (including the lower carrier inhibited layer 131 and the lower confinement layer 132 arranged sequentially from bottom to top), the active layer 14, the upper confinement unit 15 (including the upper confinement layer 151 and the upper carrier inhibited layer 152 arranged sequentially from bottom to top), the lower second n-type cladding layer 181, an etch stop layer E, the upper second n-type cladding layer 182 and the second electrode 19, which are arranged sequentially from bottom to top, wherein the lower second n-type cladding layer 181 and the upper second n-type cladding layer 182 are collectively referred to the second n-type cladding layer 18. In other words, the second n-type cladding layer 18 is divided into the lower second n-type cladding layer 181 and the upper second n-type cladding layer 182, and the etch stop layer E is formed between the lower second n-type cladding layer 181 and the upper second n-type cladding layer 182 by epitaxy, and an etching method is used to remove a part of the upper second n-type cladding layer 182 and the contact layer (the second electrode 19) to form a ridge structure, and the etch stop layer E is provided for stopping further etching. The EEL device 100 (DFB laser device) comprises: the substrate 11; the first n-type cladding layer 12 disposed at the top of the substrate 11; the tunnel junction layer 17 disposed at the top of the first n-type cladding layer 12; the p-type cladding layer 16 disposed at the top of the tunnel junction layer 17; the grating layer G disposed at the top of the p-type cladding layer 16; the spacer layer S disposed at the top of the grating layer G; the lower confinement unit 13 disposed at the top of the spacer layer S; the active layer 14 disposed at the top of the lower confinement unit 13; the upper confinement unit 15 disposed at the top of the active layer 14; the lower second n-type cladding layer 181 disposed at the top of the upper confinement unit 15; the etch stop layer E disposed at the top of the lower second n-type cladding layer 181; and the upper second n-type cladding layer 182 disposed at the top of the etch stop layer E.

Table 7 lists the structural comparison of a traditional EEL device (or DFB laser device) in accordance with the Comparative Example 4.

TABLE 7

(Comparative Example 4)

| Layer | Description | Material | Thickness (nm) | Dopant | Dopant Content (atoms/cm$^3$) | Type |
|---|---|---|---|---|---|---|
| 1 | First electrode | InP | 200 | S | $1.0 \times 10^{18} \sim 5.0 \times 10^{18}$ | n |
| 2 | Substrate | InP | 350000 | S | $1.0 \times 10^{18} \sim 5.0 \times 10^{18}$ | n |
| 3 | n-type buffer layer | InP | 500 | Si | $1.0 \times 10^{18}$ | n |
| 4 | n-type cladding layer | InP | 100 | Si | $1.0 \times 10^{18}$ | n |
| 4-1 | Grating layer | InGaAsP | 35 | Si | $1.0 \times 10^{18}$ | n |
| 4-2 | Spacer layer | InP | 150 | Si | $1.0 \times 10^{18}$ | n |
| 5 | Lower carrier inhibited layer | AlInAs | 50 | Si | $5.0 \times 10^{17}$ | n |
| 6 | Lower confinement layer | AlGaInAs | 50 | — | — | — |
| 7 | Active layer | AlGaInAs | *Note | — | — | — |
| 8 | Upper confinement layer | AlGaInAs | 50 | — | — | — |
| 9 | Upper carrier inhibited layer | AlInAs | 50 | — | — | — |
| 10 | p-type cladding layer | InP | 50 | Zn | $5.0 \times 10^{17}$ | p |
| 11 | Etch stop layer | InGaAsP | 25 | Zn | $1.0 \times 10^{18}$ | p |
| 12 | p-type cladding layer | InP | 1500 | Zn | $7.0 \times 10^{17} \sim 1.5 \times 10^{18}$ | p |
| 13 | Second electrode | InGaAs | 200 | Zn | Greater than $1.0 \times 10^{19}$ | p |

*Note:
The thickness of the active layer can be designed according to the range of light emitting wavelength for operating the EEL device.

Table 8 below lists the structural comparison of an EEL device (or DFB laser device) in accordance with the fourth embodiment of the present disclosure.

TABLE 8

(Fourth Embodiment)

| Layer | Description | Material | Thickness (nm) | Dopant | Dopant Content (atoms/cm$^3$) | Type |
|---|---|---|---|---|---|---|
| 1 | First electrode 10 | InP | 200 | S | $1.0 \times 10^{18} \sim 5.0 \times 10^{18}$ | n |
| 2 | Substrate 11 | InP | 350000 | S | $1.0 \times 10^{18} \sim 5.0 \times 10^{18}$ | n |
| 3 | n-type buffer layer (111 | InP | 500 | Si | $1.0 \times 10^{18}$ | n |
| 4 | First n-type cladding layer 12 | InP | 100 | Si | $1.0 \times 10^{18}$ | n |
| 4-3 | Tunnel junction layer 17 (heavily-doped n-type layer 172) | InGaAsP | 15 | Te | Greater than $1.0 \times 10^{19}$ | n |
| 4-4 | Tunnel junction layer17 ( heavily-doped p-type layer 171) | InGaAsP | 15 | C | Greater than $1.0 \times 1019$ | p |
| 4-5 | p-type cladding layer 16 | InP | 500 | Zn | $1.0 \times 10^{18}$ | p |
| 4-1 | Grating layer G | InGaAsP | 35 | Zn | $1.0 \times 10^{18}$ | p |
| 4-2 | Spacer layer S | InP | 150 | Zn | $1.0 \times 10^{18}$ | p |
| 5 | Lower carrier inhibited layer 131 | AlInAs | 50 | Zn | $5.0 \times 10^{17}$ | p |
| 6 | Lower confinement layer 132 | AlGaInAs | 50 | — | — | — |

TABLE 8-continued (Fourth Embodiment)

| Layer | Description | Material | Thickness (nm) | Dopant | Dopant Content (atoms/cm$^3$) | Type |
|---|---|---|---|---|---|---|
| 7 | Active layer 14 | AlGaInAs | *Note | — | — | — |
| 8 | Upper confinement layer 151 | AlGaInAs | 50 | — | — | — |
| 9 | Upper carrier inhibited layer 152 | AlInAs | 50 | — | — | — |
| 10 | Lower second n-type cladding layer 181 | InP | 50 | Si | $5.0 \times 10^{17}$ | n |
| 11 | Etch stop layer E | InGaAsP | 15 | Si | $1.0 \times 10^{18}$ | n |
| 12 | Upper second n-type cladding layer 182 | InP | 1500 | Si | $7.0 \times 10^{17} \sim 1.5 \times 10^{18}$ | n |
| 13 | Second electrode 19 | InGaAs | 200 | Te | Greater than $1.0 \times 10^{19}$ | n |

*Note:
The thickness of the active layer can be designed according to the range of light emitting wavelength for operating the EEL device.

Compared with the Comparative Example 4, the fourth embodiment has the following advantages: (1) The fourth embodiment adopts a method of inserting the tunnel junction layer between the n-type cladding layer (the 4$^{th}$ layer of Table 7) and the grating layer (the 4-1$^{th}$ layer of Table 7) of the Comparative Example 4. Since the fourth embodiment adopts the tunnel junction layer 17 (the 4-3$^{th}$ layer and the 4-4$^{th}$ layer of Table 8), so that the fourth embodiment only has the lower carrier inhibited layer 131 (thickness 50 nm), the spacer layer S (150 nm), the grating layer G (35 nm), the p-type cladding layer 16 (500 nm) and the heavily-doped p-type layer 171 of the tunnel junction layer 17 (15 nm) which are p-type semiconductors with a total thickness of 750 nm, but the Comparative Example 4 has the p-type cladding layer (50 nm), the etch stop layer (25 nm), the p-type cladding layer (1500 nm) and the second electrode (200 nm) which are p-type semiconductors with a total thickness of 1775 nm, and the p-type semiconductor of the fourth embodiment has a total thickness 750 nm which is equal to 42.25% of the total thickness 1775 nm of the p-type semiconductor of the Comparative Example 4. Since most of the series resistances come from the p-type semiconductor, therefore the fourth embodiment has a lower series resistance than the Comparative Example 4 and has a lower series resistance. (2) Based on the previous discussion as described in (1), the electron holes of the Comparative Example 4 migrate sequentially through the second electrode (200 nm), the p-type cladding layer (1500 nm), the etch stop layer (25 nm) and the p-type semiconductor of the p-type cladding layer (50 nm) with a total thickness of 1775 nm. Since the carrier in the n-type semiconductor has a mobility greater than the mobility of the carrier in the p-type semiconductor, therefore the electrons/electron holes of the Comparative Example 4 are coupled at the upper half of the active layer (the 7$^{th}$ layer) to emit light, such that most of the optical field L is deviated at the upper half of the active layer, and the lower half of the active layer cannot be utilized effectively, thereby leading to the results that the modal gain cannot be increased, the threshold current value cannot be reduced, the high operating speed cannot be achieved and the operation cannot be performed at high temperature. However, the electron holes of the fourth embodiment electron hole migrate through a total thickness (only 750 nm) of the p-type semiconductor which is equal to 42.25% of the total thickness 1775 nm of the p-type semiconductor of the Comparative Example 4, such that the optical field L of the first embodiment tends to be coupled with the quantum wells of the active layer 14 more at the middle position of the thickness of the active layer 14, and both of the upper half and the lower half of the active layer 14 can be utilized effectively, and the vertical deviation of the optical field can be compensated to achieve the effects of increasing the modal gain, reducing the threshold current value, making the edge emitting laser device able to be operated at a high temperature condition, and providing a high operating speed. (3) The Comparative Example 4 adopts the N (n-type cladding layer, the 4$^{th}$ layer of Table 7)-i (active layer, the 7$^{th}$ layer of Table 7)-P (p-type cladding layer, the 10$^{th}$ layer of Table 7) structure, and the aforementioned layers are arranged sequentially from bottom to top. Since the fourth embodiment adopts the tunnel junction layer 17 (the 4-3$^{th}$ layer and the 4-4$^{th}$ layer of Table 8), such that the fourth embodiment adopts the P (the 4-5$^{th}$ layer of Table 8, the p-type cladding layer 16)-i (the 7$^{th}$ layer of Table 8, the active layer 14)-N (the 10$^{th}$ layer of Table 8, the lower second n-type cladding layer 181) structure and uses the reverse growth P-i-N structure to reduce one p-type ohmic contact (the 13$^{th}$ layer of the Comparative Example 4) metallization procedure, so as to simplify the manufacturing process. (4) Based on the discussion in (2), when the structure of the Comparative Example 4 is operated, most of the optical field deviates at the upper half of the active layer, thereby causing a longer distance of the optical field from the grating layer (the 4-1$^{th}$ layer of Table 7), a lower coupling efficiency of the optical field/grating, and a higher threshold current value, but when the structure of the fourth embodiment is operated, the optical field tends to be coupled at the middle position of the thickness of the active layer 14, thereby causing a shorter distance of the optical field from the grating layer G (the 4-1$^{th}$ layer of Table 8), a better coupling efficiency of the optical field/grating and a lower threshold current value, so that the edge emitting laser device can be operated at a high temperature condition and has a high operating speed.

Figure 6:
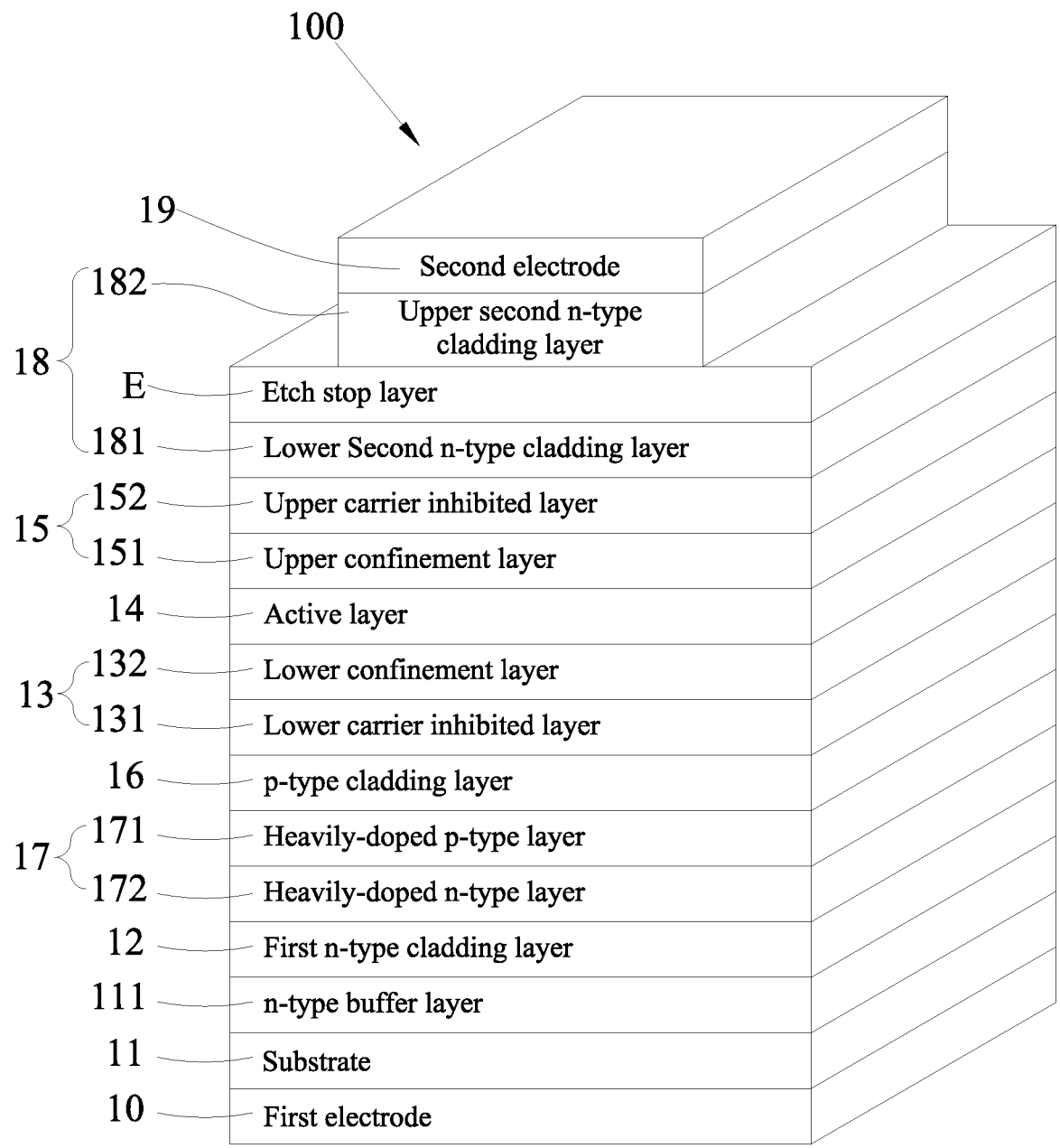
FIG. 6 is a cross-sectional view of the P-i-N arranged structure of an EEL device in accordance with a fifth embodiment of the present disclosure.

In another implementation mode of the present disclosure, an edge emitting laser (EEL) device 100 is a FP laser device (Refer to FIG. 6), and the EEL device 100 (FP laser device) includes: the first electrode 10, the substrate 11, the n-type buffer layer 111, the first n-type cladding layer 12, the tunnel junction layer 17 (including the heavily-doped n-type layer 172 and the heavily-doped p-type layer 171 arranged sequentially from bottom to top), the p-type cladding layer 16, the lower confinement unit 13 (including the lower carrier inhibited layer 131 and the lower confinement layer 132 arranged sequentially from bottom to top), the active layer 14, the upper confinement unit 15 (including the upper confinement layer 151 and the upper carrier inhibited layer 152 arranged sequentially from bottom to top), the lower second n-type cladding layer 181, the etch stop layer E, the upper second n-type cladding layer 182 and the second electrode 19 which are arranged from bottom to top, wherein the lower second n-type cladding layer 181 and the upper second n-type cladding layer 182 are collectively referred to the second n-type cladding layer 18.

In other words, the second n-type cladding layer 18 is divided into the lower second n-type cladding layer 181 and the upper second n-type cladding layer 182, and the etch stop layer E is formed between the lower second n-type cladding layer 181 and the upper second n-type cladding layer 182 by epitaxy, and an etching method is used to remove a part of the upper second n-type cladding layer 182 and the contact layer (the second electrode 19) to form a ridge structure, and the etch stop layer E is provided for stopping further etching. In other words, the EEL device comprises: a substrate 11; a first n-type cladding layer 12, disposed at the top of the substrate 11; a tunnel junction layer 17, disposed at the top of the first n-type cladding layer 12; a p-type cladding layer 16, disposed at the top of the tunnel junction layer 17; a lower confinement unit 13, disposed at the top of the p-type cladding layer 16; an active layer 14, disposed at the top of the lower confinement unit 13; an upper confinement unit 15, disposed at the top of the active layer 14; a lower second n-type cladding layer 181, disposed at the top of the upper confinement unit 15; an etch stop layer E, disposed at the top of the lower second n-type cladding layer 181; and an upper second n-type cladding layer 182, disposed at the top of the etch stop layer E.

Table 9 lists the structural comparison of a traditional EEL device (or DFB laser device) in accordance with the second embodiment of the present disclosure.

Table 9 below lists the structural comparison of the structure of the Comparative Example 5 in accordance with a traditional EEL device (FP laser device).

TABLE 9

(Comparative Example 5)

| Layer | Description | Material | Thickness (nm) | Dopant | Dopant Content (atoms/cm$^3$) | Type |
|---|---|---|---|---|---|---|
| 1 | First electrode | InP | 200 | S | $1.0 \times 10^{18} \sim 5.0 \times 10^{18}$ | n |
| 2 | Substrate | InP | 350000 | S | $1.0 \times 10^{18} \sim 5.0 \times 10^{18}$ | n |
| 3 | n-type buffer layer | InP | 500 | Si | $1.0 \times 10^{18}$ | n |
| 4 | n-type cladding layer | InP | 100 | Si | $1.0 \times 10^{18}$ | n |
| 5 | Lower carrier inhibited layer | AlInAs | 140 | Si | $5.0 \times 10^{17}$ | n |
| 6 | Lower confinement layer | AlGaInAs | 50 | — | — | — |
| 7 | Active layer | AlGaInAs | *Note | — | — | — |
| 8 | Upper confinement layer | AlGaInAs | 50 | — | — | — |
| 9 | Upper carrier inhibited layer | AlInAs | 50 | — | — | — |
| 10 | p-type cladding layer | InP | 50 | Zn | $5.0 \times 10^{17}$ | p |
| 11 | Etch stop layer | InGaAsP | 25 | Zn | $1.0 \times 10^{18}$ | p |
| 12 | p-type cladding layer | InP | 1500 | Zn | $7.0 \times 10^{17} \sim 1.5 \times 10^{18}$ | p |
| 13 | Second electrode | InGaAs | 200 | Zn | Greater than $1.0 \times 10^{19}$ | p |

* Note:
The thickness of the active layer can be designed according to the range of light emitting wavelength for operating the EEL device.

Table 10 below lists the structural comparison of the structure of an EEL device (FP laser device) in accordance with the fifth embodiment of the present disclosure.

TABLE 10

(The fifth embodiment)

| Layer | Description | Material | Thickness (nm) | Dopant | Dopant Content (atoms/cm$^3$) | Type |
|---|---|---|---|---|---|---|
| 1 | First electrode 10 | InP | 200 | S | $1.0 \times 10^{18} \sim 5.0 \times 10^{18}$ | n |
| 2 | Substrate 11 | InP | 350000 | S | $1.0 \times 10^{18} \sim 5.0 \times 10^{18}$ | n |
| 3 | n-type buffer layer (111 | InP | 500 | Si | $1.0 \times 10^{18}$ | n |
| 4 | n-type cladding layer (12 | InP | 100 | Si | $1.0 \times 10^{18}$ | n |
| 4-1 | Tunnel junction layer 17 | InGaAsP | 15 | Te | greater than $1.0 \times 10^{19}$ | n |

TABLE 10-continued (The fifth embodiment)

| Layer | Description | Material | Thickness (nm) | Dopant | Dopant Content (atoms/cm$^3$) | Type |
|---|---|---|---|---|---|---|
| | (heavily-doped n-type layer 172) | | | | | |
| 4-2 | Tunnel junction layer 17 (heavily-doped p-type layer 171) | InGaAsP | 15 | C | greater than $1.0 \times 10^{19}$ | p |
| 4-3 | p-type cladding layer 16 | InP | 50 | Zn | $5.0 \times 10^{17}$ | p |
| 5 | Lower carrier inhibited layer 131 | AlInAs | 140 | — | — | — |
| 6 | Lower confinement layer 132 | AlGaInAs | 50 | — | — | — |
| 7 | active layer 14 | AlGaInAs | *Note | — | — | — |
| 8 | Upper confinement layer 151 | AlGaInAs | 50 | — | — | — |
| 9 | Upper carrier inhibited layer 152 | AlInAs | 50 | — | — | — |
| 10 | Lower second n-type cladding layer 181 | InP | 50 | Si | $5.0 \times 10^{17}$ | n |
| 11 | Etch stop layer E | InGaAsP | 15 | Si | $1.0 \times 10^{18}$ | n |
| 12 | Upper second n-type cladding layer 182 | InP | 1500 | Si | $7.0 \times 10^{17} \sim 1.5 \times 10^{18}$ | n |
| 13 | Second electrode 19 | InGaAs | 200 | Te | Greater than $1.0 \times 10^{19}$ | n |

*Note:
The thickness of the active layer can be designed according to the range of light emitting wavelength for operating the EEL device.

Compared with the Comparative Example 5, the fifth embodiment has the following advantages: (1) The fifth embodiment adopts the method of inserting the tunnel junction layer between the n-type cladding layer (the 4$^{th}$ layer of Table 9) and the lower carrier inhibited layer (the 5$^{th}$ layer of Table 9) of the Comparative Example 5, and the fifth embodiment adopts the tunnel junction layer 17 (the 4-1$^{th}$ layer and the 4-2$^{th}$ layer of Table 10), such that the fifth embodiment only has the heavily-doped p-type layer 171 (15 nm) of the tunnel junction layer 17 and the p-type cladding layer 16 (50 nm) which are p-type semiconductors with a total thickness of 65 nm, but the Comparative Example 5 has the p-type cladding layer (50 nm), the etch stop layer (25 nm), the p-type cladding layer (1500 nm) and the second electrode (200 nm) which are p-type semiconductors with a total thickness of 1775 nm, and the total thickness (65 nm) of the p-type semiconductor of the fifth embodiment is equal to 3.66% of the total thickness (1775 nm) of the p-type semiconductor of the Comparative Example 5. Since most of the series resistances come from the p-type semiconductor, the fifth embodiment has a lower series resistance than the Comparative Example 5. (2) Based on the previous discussion in (1), the electron holes of the Comparative Example 1 migrate sequentially through the second electrode (200 nm), the p-type cladding layer (1500 nm), the etch stop layer (25 nm) and the p-type semiconductor of the p-type cladding layer (50 nm) with a total thickness of 1775 nm. Since the carrier in the n-type semiconductor has a mobility greater than the mobility of the carrier in the p-type semiconductor, therefore the electrons/electron holes of the Comparative Example 1 are coupled at the upper half of the active layer (the 7$^{th}$ layer) to emit light, such that most of the optical field L is deviated at the upper half of the active, and the lower half of the active layer cannot be utilized effectively, thereby leading to the results that the modal gain cannot be increased, the threshold current value cannot be reduced, the high operating speed cannot be achieved and the operation cannot be performed at high temperature. However, the electron holes of the fifth embodiment migrate through a total thickness (only 65 nm) of the p-type semiconductor, which is equal to 3.66% of the total thickness 1775 nm of the p-type semiconductor of the Comparative Example 5, such that the optical field L of the fifth embodiment tends to be coupled with the quantum wells of the active layer 14 more at the middle position of the thickness of the active layer 14, and both of the upper half and the lower half of the active layer 14 can be utilized effectively, and the vertical deviation of the optical field can be compensated to achieve the effects of increasing the modal gain, reducing the threshold current value, making the edge emitting laser device able to be operated at a high temperature condition, and providing a high operating speed. (3) The Comparative Example 5 adopts the N (n-type cladding layer, the 4$^{th}$ layer of Table 9)-i (active layer, the 7$^{th}$ layer of Table 9)-P (p-type cladding layer, the 10$^{th}$ layer of Table 9) structure, and the aforementioned layers are arranged sequentially from bottom to top. Since the fifth embodiment adopts the tunnel junction layer 17 (the 4-1$^{th}$ layer and the 4-2$^{th}$ layer of Table 10), such that the fifth embodiment adopts the P (the 4-3$^{th}$ layer of Table 10, the p-type cladding layer 16)-i (the 7$^{th}$ layer of Table 10, active layer 14)-N (the 10$^{th}$ layer of Table 10, the lower second n-type cladding layer 181) structure and uses the reverse growth P-i-N structure to reduce one p-type ohmic contact (the 13th layer of Table 9 of the Comparative Example 5) metallization procedure, so as to simplify the manufacturing process.

It is noteworthy that the fourth embodiment can be regarded as the EEL laser device based on the fifth embodiment and further including a spacer layer S and a grating layer G disposed between the p-type cladding layer 16 and the lower confinement unit 13, wherein the grating layer G is disposed at the top of the p-type cladding layer 16, and the spacer layer S is disposed at the top of the grating layer G, and the lower confinement unit 13 is disposed at the top of the spacer layer S.

The present disclosure uses the tunnel junction layer to convert a part of the p-type cladding layer into the n-type cladding layer and reduce the series resistance of the edge emitting laser device. The present disclosure is further based on the method of converting a part of the p-type cladding layer into the n-type cladding layer, such that the optical field tends to be coupled with the quantum well of the active layer at the middle position of the thickness of the active layer, so that the lower half of the active layer can be utilized effectively and the vertical deviation of the optical field can be compensated to achieve the effects of increasing the modal gain, reducing the threshold current value, making the edge emitting laser device able to be operated at a high temperature condition, and providing a high operating speed.

The present disclosure is further based on the method of converting a part of p-type cladding layer into the n-type cladding layer, such that the distance of the optical field from the grating layer is shorter, the coupling efficiency of the optical field/grating is better, and the threshold current value is lower. As a result, the edge emitting laser device can be operated at a high temperature condition and has a high operating speed. In addition, the present disclosure converts a part of the p-type cladding layer into the n-type cladding layer, such that the arrangement of the N-i-P structure is converted into the arrangement of the P-i-N structure to reduce one p-type ohmic contact metallization procedure, so as to simplify the manufacturing process.

What is claimed is:

1. An edge emitting laser (EEL) device, comprising:
   a substrate;
   a first n-type cladding layer, disposed at top of the substrate;
   a grating layer, disposed at top of the first n-type cladding layer;
   a spacer layer, disposed at top of the grating layer;
   a lower confinement unit, disposed at top of the spacer layer;
   an active layer, disposed at top of the lower confinement unit;
   an upper confinement unit, disposed at top of the active layer;
   a p-type cladding layer, disposed at top of the upper confinement unit;
   a tunnel junction layer, disposed at top of the p-type cladding layer; and
   a second n-type cladding layer, disposed at top of the tunnel junction layer.

2. The EEL device according to claim 1, wherein the tunnel junction layer is also an etch stop layer.

3. The EEL device according to claim 2, wherein the tunnel junction layer is made of a material selected from the group consisting of InGaAsP, AlGaInAs, InGaAs and AlInAs.

4. The EEL device according to claim 1, wherein the EEL device has an optical field coupled with the active layer at a middle position of the thickness of the active layer.

* * * * *